(12) United States Patent
Joshi et al.

(10) Patent No.: US 10,008,653 B2
(45) Date of Patent: Jun. 26, 2018

(54) NBFESB BASED HALF-HEUSLER THERMOELECTRIC MATERIALS AND METHODS OF FABRICATION AND USE

(71) Applicant: University of Houston System, Houston, TX (US)

(72) Inventors: Giri Joshi, Maynard, MA (US); Jian Yang, Brookline, MA (US); Michael Engber, Boston, MA (US); Tej Pantha, Waltham, MA (US); Martin Cleary, Somerville, MA (US); Zhifeng Ren, Houston, TX (US); Ran He, Houston, TX (US); Boris Kozinsky, Waban, MA (US)

(73) Assignees: UNIVERSITY OF HOUSTON SYSTEM, Houston, TX (US); U.S. DEPARTMENT OF ENERGY, Washington, DC (US)

( * ) Notice: Subject to any disclaimer, the term of this patent is extended or adjusted under 35 U.S.C. 154(b) by 67 days.

(21) Appl. No.: 14/667,056

(22) Filed: Mar. 24, 2015

(65) Prior Publication Data
US 2015/0270465 A1    Sep. 24, 2015

Related U.S. Application Data

(60) Provisional application No. 61/969,344, filed on Mar. 24, 2014.

(51) Int. Cl.
*H01L 35/18*    (2006.01)
*H01L 35/20*    (2006.01)
(Continued)

(52) U.S. Cl.
CPC ............... *H01L 35/18* (2013.01); *C22C 1/04* (2013.01); *C22C 12/00* (2013.01);
(Continued)

(58) Field of Classification Search
CPC ....................................... H01L 35/18
(Continued)

(56) References Cited

U.S. PATENT DOCUMENTS

2010/0163091 A1*  7/2010  Liu ............... H01L 35/22
                                                  136/236.1
2010/0193001 A1*  8/2010  Hirono ........... C22C 12/00
                                                  136/205

(Continued)

OTHER PUBLICATIONS

Yu et al. Reduced Grain Size and Improved Thermoelectric Properties of Melt Spun (Hf, Zr)NiSn Half-Heusler Alloys, Electronic Materials, vol. 39, No. 9, pp. 2008-2012 (2009).*
(Continued)

*Primary Examiner* — Jayne L Mershon
(74) *Attorney, Agent, or Firm* — Conley Rose, P.C.

(57) ABSTRACT

A thermoelectric half-Heusler material comprising niobium (Nb), iron (Fe) and antimony (Sb) wherein the material comprises grains having a mean grain size less than one micron. A method of making a nanocomposite half-Heusler thermoelectric material includes melting constituent elements of the thermoelectric material to form an alloy of the thermoelectric material, comminuting (e.g., ball milling) the alloy of the thermoelectric material into nanometer scale mean size particles, and consolidating the nanometer size particles to form the half-Heusler thermoelectric material comprising at least niobium (Nb), iron (Fe) and antimony (Sb) and having grains with a mean grain size less than one micron.

33 Claims, 21 Drawing Sheets

(51) Int. Cl.
*H01L 35/34* (2006.01)
*C22C 1/04* (2006.01)
*C22C 12/00* (2006.01)
*C22C 33/02* (2006.01)
*C22C 38/00* (2006.01)

(52) U.S. Cl.
CPC .......... *C22C 33/0278* (2013.01); *C22C 38/00* (2013.01); *H01L 35/20* (2013.01); *H01L 35/34* (2013.01); *B22F 2998/10* (2013.01)

(58) Field of Classification Search
USPC ....................................................... 136/240
See application file for complete search history.

(56) References Cited

U.S. PATENT DOCUMENTS

2012/0326097 A1* 12/2012 Ren .................. H01L 35/18
252/513
2013/0031895 A1* 2/2013 Glaser ................ F28F 3/02
60/320

OTHER PUBLICATIONS

Joshi, Giri, et al., "Enhancement of Thermoelectric Figure-of-Merit at Low Temperatures by Titanium Substitution for Hafniumin n-type half-Heuslers Hf0.75-xTixZr0.25NiSn0.99Sb0.01," SciVerse ScienceDirect, NanoEnergy 2013, vol. 2, pp. 82-87 (6 p.).
Chen, Shuo, et al., "Effect of Hf Concentration on Thermoelectric Properties of Nanostructured N-Type Half-Heusler Materials Hf x Zr 1-x NiSn 0.99 Sb 0.01," Advanced Energy Materials, 2013, vol. 3, pp. 1210-1214 (5 p.).

* cited by examiner

NBFESB BASED HALF-HEUSLER THERMOELECTRIC MATERIALS AND METHODS OF FABRICATION AND USE

CROSS-REFERENCE TO RELATED APPLICATIONS

This application claims priority to and incorporates in its entirety U.S. Provisional Pat. App. No. 61/969,344 "NbFeSb-Based Half-Heusler Thermoelectric Materials and Methods of Making," filed Mar. 24, 2014.

RESEARCH OR DEVELOPMENT

This invention was made with government support under grant number DE-EE0004840 from the U.S. Department of Energy. The government may have certain rights in the invention.

BACKGROUND

Half-Heuslers (HHs) are intermetallic compounds which have great potential as high temperature thermoelectric materials for power generation. However, the dimensionless thermoelectric figure-of-merit (ZT) of HHs is lower than that of the most state-of-the-art thermoelectric materials. HHs are complex compounds, including MCoSb (p-type) and MNiSn (n-type), where M can be Ti or Zr or Hf or combination of two or three of the elements. They form in cubic crystal structure with a F4/3m (No. 216) space group. These phases are semiconductors with 18 valence electron count (VEC) per unit cell and a narrow energy gap. The Fermi level is slightly above the top of the valence band. The HH phases have a fairly decent Seebeck coefficient with moderate electrical conductivity. The performance of thermoelectric materials depends on ZT, defined by $ZT=(S^2\sigma/\kappa)T$, where $\sigma$ is the electrical conductivity, S the Seebeck coefficient, $\kappa$ the thermal conductivity, and T the absolute temperature. Half-Heusler compounds may be good thermoelectric materials due to their high power factor ($S^2\sigma$). It has been reported that the MNiSn phases are promising n-type thermoelectric materials with exceptionally large power factors and MCoSb phases are promising p-type materials. In recent years, different approaches have been reported that have improved the ZT of half-Heusler compounds.

SUMMARY

In an embodiment, a thermoelectric half-Heusler material comprising: niobium (Nb), iron (Fe), and antimony (Sb), wherein the material comprises a mean grain size less than one micron.

In an alternate embodiment, method of making a nanocomposite half-Heusler thermoelectric material comprising: melting constituent elements of the thermoelectric material to form an alloy of the thermoelectric material; comminuting the alloy of the thermoelectric material into nanometer scale mean size particles; and consolidating the nanometer scale mean size particles to form the half-Heusler thermoelectric material comprising niobium (Nb), iron (Fe), and antimony (Sb) and grains with a mean grain size less than one micron.

In an alternate embodiment, a thermoelectric half-Heusler material comprising niobium (Nb), iron (Fe) and antimony (Sb), wherein at least one of: (i) a portion of the niobium in the half-Heusler material is substituted with titanium (Ti); and (ii) a portion of the antimony in the half-Heusler material is substituted with tin (Sn).

In an embodiment, a thermoelectric device comprising: a first pair of thermoelectric legs, each of the first pair of legs comprising a first end, a second end, and a first n-type thermoelectric material; a second pair of thermoelectric legs, each of the second pair of legs comprising a first end, a second end, and a p-type thermoelectric material, wherein the first pair of thermoelectric legs are disposed parallel to the second pair of thermoelectric legs, and wherein the p-type thermoelectric material comprises a composition according to the formula $Nb_{1+\delta-x}A_xFe_{1-y}Co_ySb_{1+\delta-z}Sn_z$; a first end of the device comprising a first electrical conductor and a second electrical conductor coupled to the first end of each of the first pair of thermoelectric legs and the first end of each of the second pair of thermoelectric legs; and a second end of the device comprising a header coupled to the second end of each of the first pair of thermoelectric legs and to the second end of each of the second pair of the thermoelectric legs.

DETAILED DESCRIPTION OF EXEMPLARY EMBODIMENTS

Figure 1:
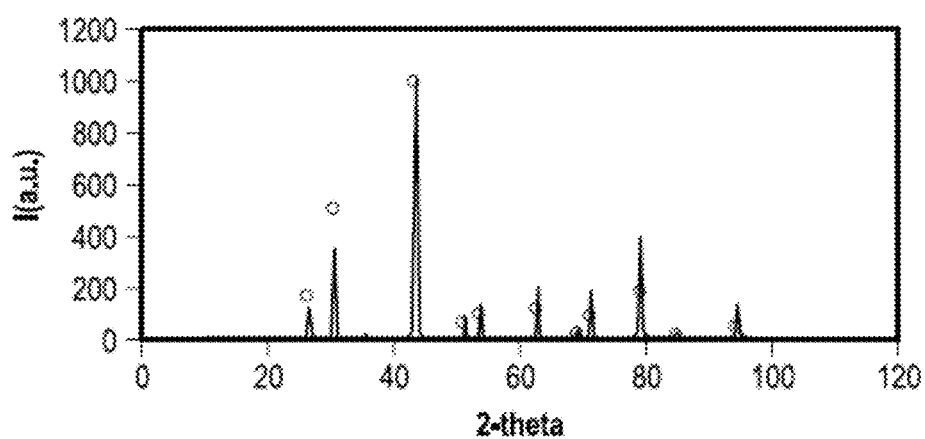
FIG. 1 illustrates the x-ray diffraction (XRD) pattern of an as-pressed sample of $Nb_{0.75}Ti_{0.25}FeSb_{0.95}Sn_{0.05}$ material fabricated according to certain embodiments of the present disclosure.

As discussed above, n-type and p-type half-Heusler thermoelectric materials, such as MNiSn (n-type) and MCoSb (p-type) materials, where M=Hf, Zr and/or Ti, are promising thermoelectric materials that exhibit high mechanical strength, thermal stability, low toxicity, and improved thermoelectric performance (e.g., ZT), particularly over a temperature range (e.g., 20-700° C.) useful in many low- to mid-temperature applications, such as waste heat recovery in automobiles.

The cost of these materials depends largely on the hafnium content of the material, since hafnium is significantly more expensive than the other constituents of the material. Thus, materials with similar performance characteristics but without the same high material costs are desirable.

Embodiments include a p-type thermoelectric half-Heusler material comprising niobium (Nb), iron (Fe) and antimony (Sb) wherein the material comprises grains having a mean grain size less than one micron. A peak ZT of about 1 was achieved at 700° C., which is comparable to the ZT values of p-type MCoSb materials, where M=Hf with Zr and/or Ti, as disclosed in U.S. Published Patent Application No. 2013/0175484 to Ren et al., which is incorporated in its entirety by reference herein. In an embodiment, the material may be made by comminuting (e.g., ball milling) a solid alloy (e.g., ingot) having a composition $Nb_{1+\delta-x}A_xFe_{1-y}Co_ySb_{1+\delta-z}Sn_z$ where A comprises one or more of titanium (Ti), zirconium (Zr), hafnium (Hf), vanadium (V), tantalum (Ta), chromium (Cr), molybdenum (Mo), tungsten (W), and a rare earth element, such as scandium (Sc) and yttrium (Y), and $0 \leq x<1.0$, $0 \leq y<1.0$, $0 \leq z<1.0$, and $-0.1 \leq \delta \leq 0.1$, into nanopowders and consolidating the powders, such as via hot pressing, into dense bulk samples.

In an embodiment, the solid alloy (e.g., ingot) may be formed by arc melting and/or induction melting of the constituent elements. In various embodiments, the consolidated dense bulk samples are nanostructured with grains having a mean grain size less than 300 nm in which at least 90% of the grains are less than 500 nm in size. In an embodiment, the grains may have a mean size in a range of about 10 to about 300 nm, including a mean size of around 200 nm. Typically, the grains have random orientations. Further, many grains may include 10-50 nm size (e.g., diameter or width) nanodot inclusions within the grains. In an embodiment, the enhanced ZT values for the half-Heusler material may be due in part to the grain structure of the material producing a reduction of thermal conductivity due to increased phonon scattering at grain boundaries and crystal defects, as well as optimization of antimony doping.

The solid alloy may be made by arc melting individual elements of the thermoelectric material in the appropriate ratio to form the desired thermoelectric material. Alternatively, the solid alloy may be made by induction melting the individual elements of the thermoelectric material in the appropriate ratio. Preferably, the individual elements are 99.0% pure. More preferably, the individual elements are 99.9% pure. In an alternative embodiment, two or more of the individual elements may first be combined into an alloy or compound and the alloy or compound used as one of the starting materials in the arc melting or induction melting process.

In an embodiment, the solid alloy (e.g., melted ingot) may be annealed at elevated temperature (e.g., 600-800° C., such as about 700° C.) in a sub-atmospheric (e.g., vacuum) environment at a pressure of less than 760 Torr (e.g., less than 25 Torr, such as $10^{-3}$-25 Torr). The alloy may be annealed for 0.5-3 days, such as about 24 hours, prior to ball milling.

In an embodiment, the solid alloy may be ball milled for 1-20 hours (e.g., 1-10 hours) in an inert gas (e.g., argon) environment. In embodiments, the ball milling may result in a nanopowder with nanometer size particles that have a mean size less than 1000 nm in which at least 90% of the particles are less than 250 nm in size. In another embodiment, the nanometer size particles have a mean particle size in a range of 5-100 nm.

In an embodiment, the nanometer size particles may be consolidated by loading the particles into a die cavity of a hot press apparatus and hot pressing the particles at an elevated temperature (e.g., peak temperature of 700-1100° C., such as about 900° C.) and pressure (e.g., 60-200 MPa) to form a sintered body of the thermoelectric material comprised of a plurality of grains. The figure of merit (ZT) of thermoelectric materials improves as the grain size in the thermoelectric material decreases. In one embodiment of the method, thermoelectric materials with nanometer scale (less than 1 micron) grains are produced, i.e., 95%, such as 100% of the grains have a grain size less than 1 micron. Preferably, the nanometer scale mean grain size is in a range of about 10 nm to about 300 nm. Embodiments of the method may be used to fabricate a p-type half-Heusler thermoelectric material having the formula $Nb_{1+\delta-x}A_xFe_{1-y}Co_ySb_{1+\delta-z}Sn_z$ where A comprises one or more of titanium (Ti), zirconium (Zr), hafnium (Hf), vanadium (V), tantalum (Ta), chromium (Cr), molybdenum (Mo), tungsten (W), and a rare earth element, such as scandium (Sc) and yttrium (Y), and $0 \leq x<1.0$, $0 \leq y<1.0$, $0 \leq z<1.0$ and $-0.1 \leq \delta \leq 0.1$ (to allow for slightly non-stoichiometric material), such as $Nb_{1+\delta-x}A_xFe_{1-y}Co_ySb_{1+\delta-z}Sn_z$, where $0 \leq x<1.0$, $0 \leq y<1.0$, $0 \leq z<1.0$ when $\delta=0$ (i.e., for the stoichiometric material).

Embodiments of the half-Heusler materials may include varying amounts of Nb, Ti, Zr, Hf, V, Ta, Cr, Mo, W, one or more rare earth elements, Fe, Co, Sb and/or Sn. Example p-type materials include, but are not limited to $Nb_{1+\delta-x}Ti_xFe_{1-y}Co_ySb_{1+\delta-z}Sn_z$ with $0 \leq x \leq 0.5$ (including $0.05 \leq x \leq 0.4$), $0 \leq y<1.0$, $0 \leq z \leq 0.2$ (including $0<z \leq 0.1$) and $-0.1 \leq \delta \leq 0.1$.

The following are examples of methods and thermoelectric materials according to this disclosure. These examples are illustrative and not meant to be limiting.

EXAMPLES

The p-type half-Heusler materials were prepared by melting niobium, titanium, iron, antimony and tin pieces according to compositions $Nb_{0.75}Ti_{0.25}FeSb_{1-z}Sn_z$ ($0 \leq z \leq 0.2$) and $Nb_{1-x}Ti_xFeSb_{0.975}Sn_{0.025}$ ($0 \leq x \leq 0.4$) (15-50 g/batch) using an arc melting process to produce solid ingots. The ingots were then annealed at 700° C. in a vacuum sealed quartz tube for 24 hours. The annealed ingots were then ball milled for approximately 7 hours in an inert gas (e.g., argon) environment to get the desired nanopowders with a commercially available ball milling machine (SPEX 8000D Mixer/Mill). The mechanically prepared nanopowders were then hot pressed at temperatures of ~900° C. and pressures of 60-120 MPa into disks of 12.7 mm diameter and 1-5 mm thickness to produce nanostructured bulk half-Heusler samples.

The samples were characterized by X-ray diffraction (XRD). FIG. 1 shows the XRD pattern of an as-pressed sample of $Nb_{0.75}Ti_{0.25}FeSb_{0.95}Sn_{0.05}$ material, and the diffraction peaks are well-matched with those of half-Heusler phases/structure.

The nanostructured bulk samples were formed into 12.7 mm diameter discs with appropriate thickness for thermal diffusivity and Hall coefficient measurements, and smaller (e.g., about 2 mm thick) samples for electrical conductivity and Seebeck coefficient measurements. The electrical resistivity and Seebeck coefficient were measured by commercial equipment (e.g., ZEM-3, Ulvac), the thermal diffusivity was measured by a laser flash system (e.g., LFA 457, Netzsch) from room temperature to 700° C., the carrier concentration and mobility at room temperature were tested from Hall measurements, and the specific heat capacity was measured on a differential scanning calorimeter (e.g., DSC 404 C, Netzsch Instruments, Inc.). The thermal conductivity was calculated as the product of the thermal diffusivity, specific heat capacity, and volumetric density of the samples.

Figure 2A:
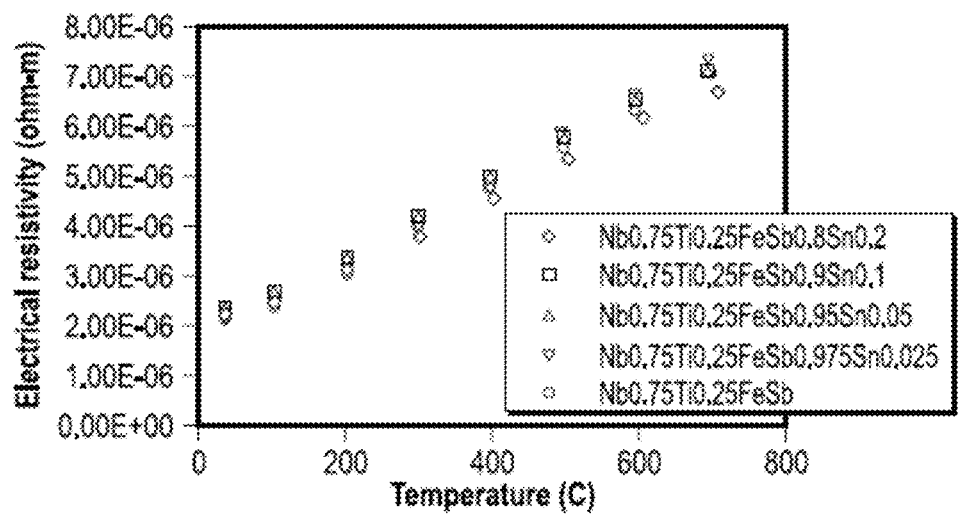
FIGS. 2A-D illustrate the temperature dependent electrical resistivity (FIG. 2A), Seebeck coefficient (FIG. 2B), thermal conductivity (FIG. 2C), and dimensionless figure of merit ZT (FIG. 2D) of $Nb_{0.75}Ti_{0.25}FeSb_{1-z}Sn_z$ fabricated according to certain embodiments of the present disclosure, where z=0, 0.025, 0.05, 0.1 and 0.2.
Figure 2B:
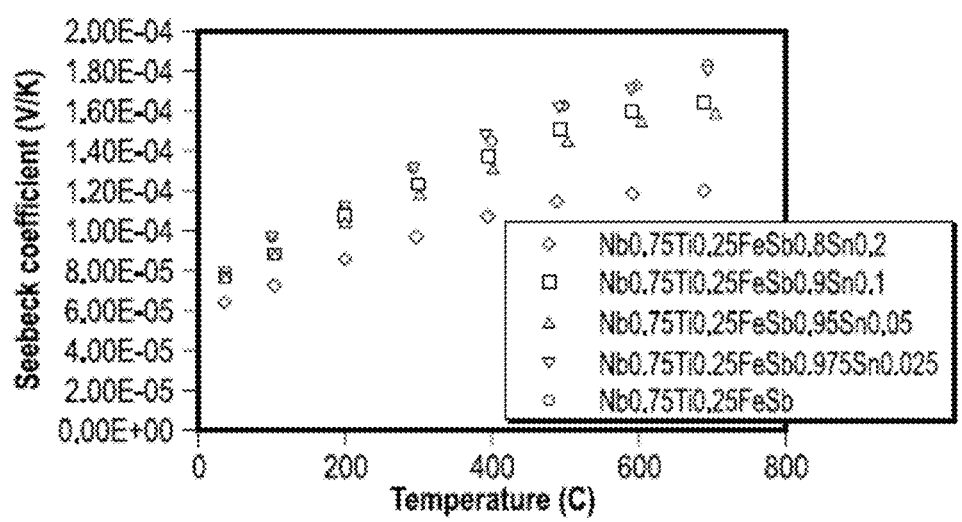
Figure 2C:
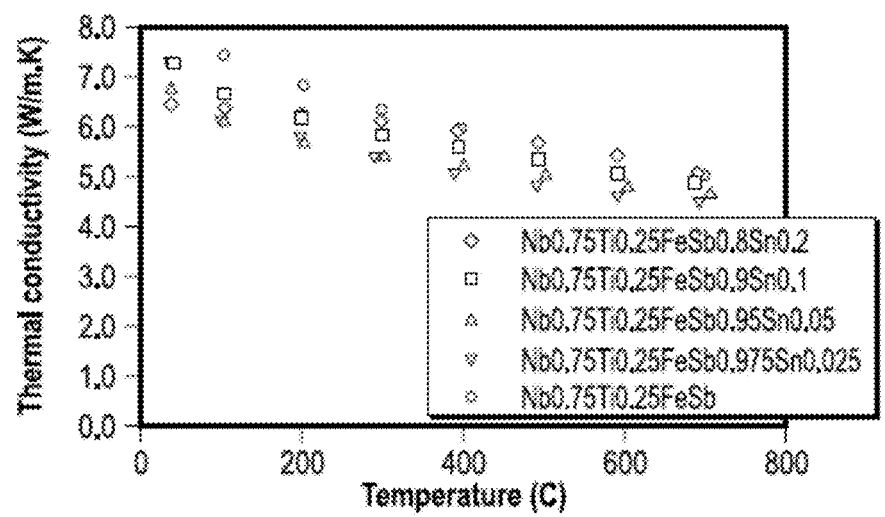
Figure 2D:
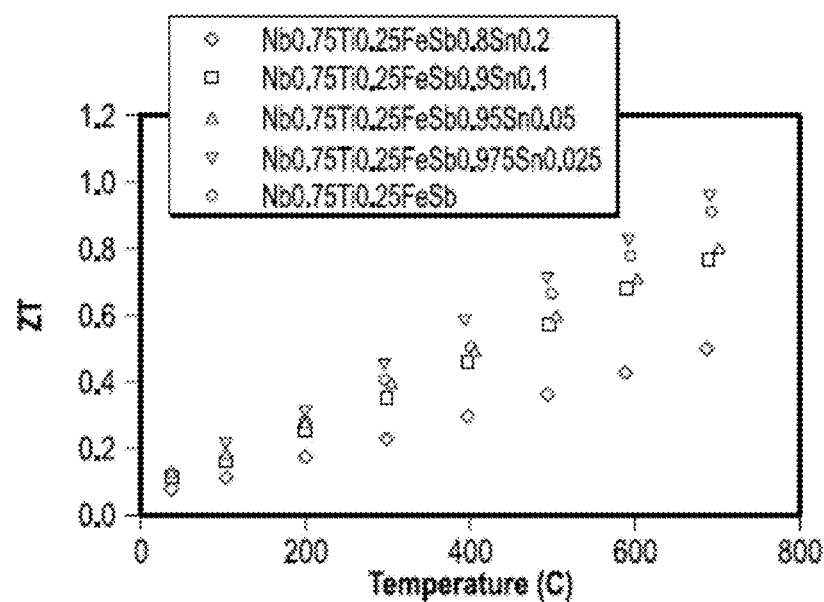
Figure 3A:
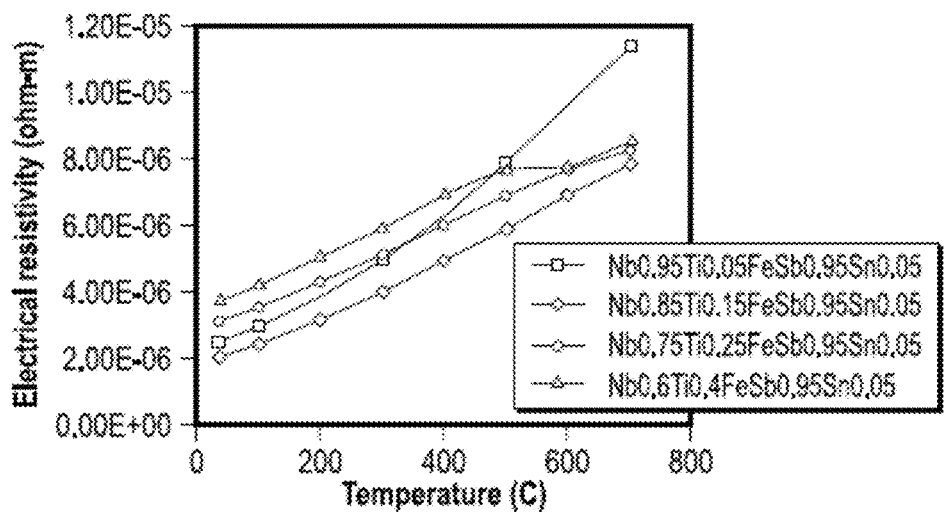
FIGS. 3A-D illustrate the temperature dependent electrical resistivity (FIG. 3A), Seebeck coefficient (FIG. 3B), thermal conductivity (FIG. 3C), and dimensionless figure of merit ZT (FIG. 3D) of $Nb_{1-x}Ti_xFeSb_{0.95}Sn_{0.05}$ fabricated according to certain embodiments of the present disclosure where x=0.05, 0.15, 0.25 and 0.4.
Figure 3B:
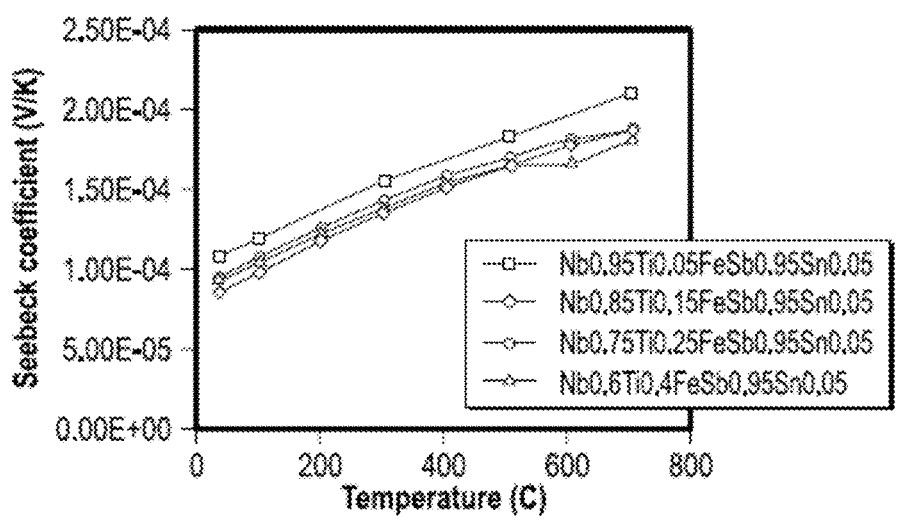
Figure 3C:
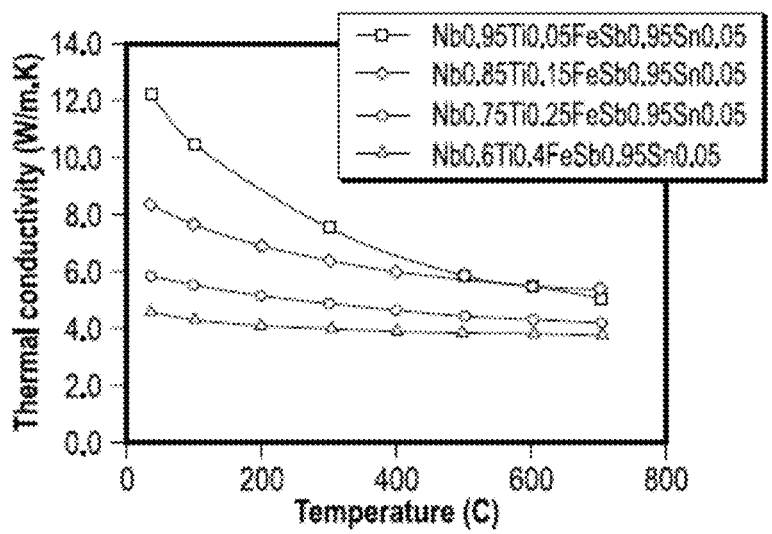
Figure 3D:
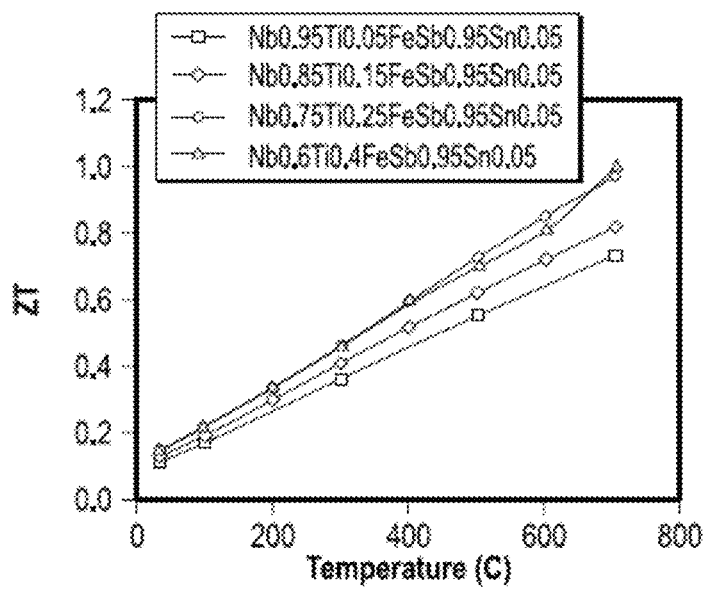

FIGS. 2A-2D show the temperature dependent electrical resistivity (FIG. 2A), Seebeck coefficient (FIG. 2B), thermal conductivity (FIG. 2C), and ZT (FIG. 2D) of five ball milled and hot pressed nanostructured samples with a composition of $Nb_{0.75}Ti_{0.25}FeSb_{1-z}Sn_z$ where z=0, 0.025, 0.05, 0.1 and 0.2. As is seen in FIG. 2A, the electrical resistivity is nearly independent of the Sb/Sn ratio. Reducing the Sn concentration tends to result in an increase in Seebeck coefficient (see FIG. 2B). The thermal conductivity is decreased with a decrease in the amount of Sn (i.e., z=0.05, 0.025) but increases slightly when there is no Sn (i.e., z=0). A peak ZT of 0.96 at 700° C. is observed for the $Nb_{0.75}Ti_{0.25}FeSb_{0.975}Sn_{0.025}$ sample, which is comparable to the p-type (Hf, Zr, Ti)CoSb materials in U.S. Published Patent Application No. 2013/0175484 to Ren et al. All five samples have ZT values greater than 0.4 for at least one temperature greater than 400° C. Four of the samples (i.e., z=0, 0.025, 0.05 and 0.1) have a ZT greater than 0.6 for at least one temperature in the range 600-800° C., and two of the samples (i.e., z=0 and 0.025) have a ZT greater than 0.8 for at least one temperature in the range 600-800° C. Embodiment materials may have a ZT of 0.9 or more (e.g., 0.9-0.97) at 700° C.

FIGS. 3A-3D show the temperature dependent electrical resistivity (FIG. 3A), Seebeck coefficient (FIG. 3B), thermal conductivity (FIG. 3C), and ZT (FIG. 3D) of five ball milled and hot pressed nanostructured samples with a composition of $Nb_{1-x}Ti_xFeSb_{0.975}Sn_{0.025}$ where x=0.05, 0.15, 0.25 and 0.4. An additional sample with x=0 (i.e., no titanium) was prepared and tested. The results of the x=0 sample are not shown in FIGS. 3A-D because the resistivity of the sample was found to be very high and thus for clarity of the graph with respect to the range of values presented in the graph, the results of this sample are not shown in comparison with the data from the other samples. The electrical resistivity (FIG. 3A) and thermal conductivity (FIG. 3C) is decreased with an increase in Ti content. Very little difference is observed in the temperature dependent ZT values for the x=0.25 and x=0.4 samples. A peak ZT of about 1.0 at 700° C. is observed for the $Nb_{0.75}Ti_{0.25}FeSb_{0.95}Sn_{0.05}$ and $Nb_{0.6}Ti_{0.4}FeSb_{0.95}Sn_{0.05}$ samples, which is comparable to the p-type (Hf, Zr, Ti)CoSb materials in U.S. Published Patent Application No. 2013/0175484 to Ren et al. All four of the illustrated samples (i.e., x=0.05, 0.15, 0.25, 0.4) have ZT values greater than 0.4 for at least one temperature greater than 400° C., and a ZT greater than 0.6 for at least one temperature in the range 600-800° C. Two of the samples (i.e., x=0.25 and 0.4) have a ZT greater than 0.8 for at least one temperature in the range 600-800° C. In alternate embodiments, the thermoelectric materials fabricated according to embodiments of the present disclosure may have a ZT of 0.9 or more (e.g., 0.9-0.99) at about 700° C.

Since the size of the nanoparticles is useful in reducing the thermal conductivity to achieve higher ZT values, the ZT of the p-type NbFeSb-based half-Heusler compounds may be increased by making the grains even smaller. For example, a mean grain size less than 100 nm may be produced by preventing grain growth during hot-pressing with a grain growth inhibitor. Exemplary grain growth inhibitors include, but are not limited to, oxides (e.g., $Al_2O_3$), carbides (e.g., SiC), nitrides (e.g., MN) and carbonates (e.g., $Na_2CO_3$). Further improvement in ZT may be possible by further optimizing the Nb/Ti ratio and/or by substituting different elements on other positions of the half-Heusler crystal structure (e.g., partial substitution of Zr or other elements on the Nb site, partial substitution of Co on the Fe site).

Figure 4:
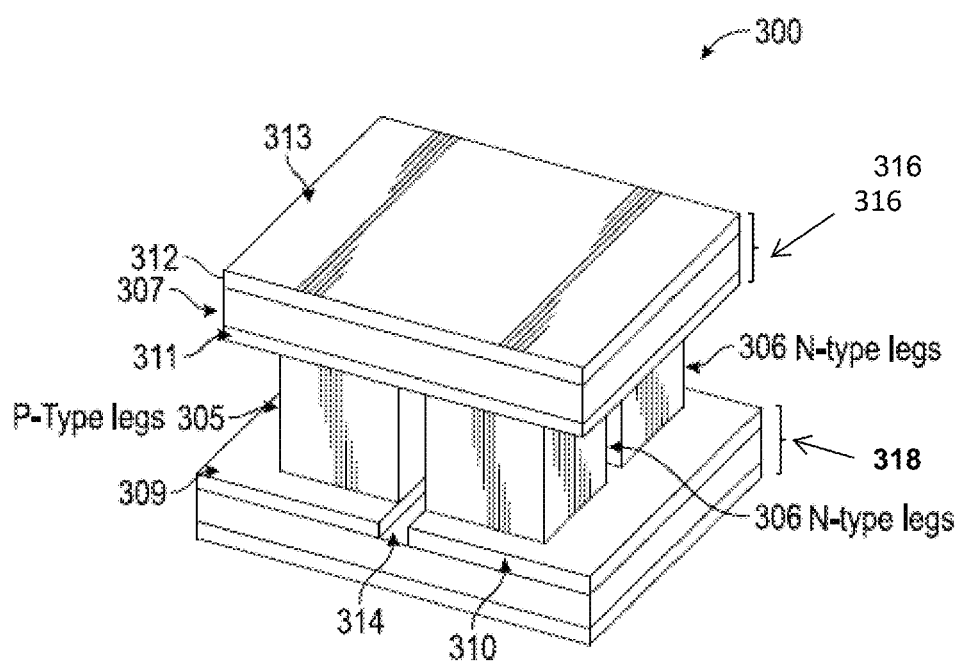
FIG. 4 schematically illustrates a thermoelectric device fabricated with a nanocomposite NbFeSb-based half-Heulser thermoelectric material fabricated according to certain embodiments of the present disclosure.

FIG. 4 schematically illustrates a thermoelectric device 300 fabricated with a nanocomposite p-type NbFeSb-based half-Heulser thermoelectric material as described above and an n-type MNiSn-based half-Heusler thermoelectric material (M=Hf, Zr and/or Ti) The n-type half-Heusler material may be a material having a relatively low hafnium content, such as the materials described in Chen et al., "Effect of Hf Concentration on Thermoelectric Properties of Nanostructured N-Type Half-Heusler Materials $Hf_xZr_{1-x}NiSn_{0.99}Sb_{0.01}$," Advanced Energy Materials 3 (2013), pp. 1210-14 and Joshi et al., "Enhancement of thermoelectric figure-of-merit at low temperatures by titanium substitution for hafnium in n-type half-Heuslers $Hf_{0.75-x}Ti_xZr_{0.25}NiSn_{0.99}Sb_{0.01}$," Nano Energy 2 (2013), pp. 82-87, both of which are incorporated by reference in their entirety herein for all purposes.

The device 300 includes a plurality of pairs of p-type thermoelectric material legs 305 and n-type thermoelectric material legs 306. Each pair of legs 305, 306 are thermally and electrically coupled at a first (e.g., hot) end 316, e.g., to form a junction 307 such as a p/n junction or p-metal-n junction. It is appreciated that a second p-type leg 305 is disposed adjacent to the p-type leg 305 visible in FIG. 4, though not visible in FIG. 4 due to the perspective of the drawing. The junction 307 may comprise a header 307 made of an electrically conductive material, such as a metal (e.g., copper). A cold side 318 may be formed in the device 300 when a first electrical connector 309 and a second electrical connector 310 (which may be metal connectors that are the same as or different than the headers 307) are coupled to the second (cold) ends of the thermoelectric legs 305, 306. In an embodiment, the thermoelectric legs 305 and 306 may be laterally offset from the header connector 307 such that for each pair of n-type and p-type legs, one leg 305 (e.g., a p-type leg) contacts the first electrical connector 309, and the other leg 306 (e.g., an n-type leg) contacts the second electrical connector 310. Thus, any arbitrary number of thermoelectric material leg pairs (i.e., "couples") may be electrically connected in series or in parallel by respective (hot side 316) headers 307 and (cold side 318) electrical connectors 309, 310, as shown in FIG. 4.

In embodiments, the metal headers 307 may include an electrically conductive material 311 (e.g., metal, such as copper) on a first (e.g., bottom) surface of the header 307 that faces the thermoelectric legs 305, 306, and an electrically insulating material 312 (e.g., a ceramic, such as alumina) adjacent to the electrically conductive material 311 opposite the legs 305, 306 to provide electrical isolation between the leg couples and a module packaging, which may include a metal cover (not shown) mounted over the couples. In embodiments, the header 307 may have a layered structure, such as a metal/ceramic/metal sandwich structure. For example, the top layer 313 of the header 307 in FIG. 4 may be a metal (e.g., copper) layer that is separated from the electrically conductive material 311 by the electrically insulating material 312 which may be referred to as the intermediate ceramic layer 312. Similarly, the electrical connectors 309, 310 on the "cold" sides 318 of the legs may also include a metal/ceramic or metal/ceramic/metal sandwich structure. The metal layers of the electrical connectors 309, 310 and the electrically conductive material 311 contacting the legs 305, 306 may be patterned (e.g., as illustrated by gap 314 between metal contact layers 309 and 310 in FIG. 4) to provide a desired circuit path across the plurality of thermoelectric legs 305, 306. In an embodiment, a module comprising a plurality of interconnected leg (305 and 306) pairs or "couples" configured similarly to the device 300 may be packaged in a module (not pictured) that generates electric power from a temperature gradient between a hot and a cold side of the module, where the hot side may comprise a plurality of hot side 316 regions and a plurality of cold side 318 regions.

In an embodiment, a device 300 fabricated in accordance with FIG. 4, comprises p-type legs 305 comprise half-Heusler material having the formula $Nb_{0.75}Ti_{0.25}FeSb_{0.9}Sn_{0.1}$ and made in accordance with the nanocomposite technique described above. The n-type legs 306 comprise half-Heusler material having the formula $Hf_{0.25}Zr_{0.75}NiSb_{0.99}Sn_{0.01}$ and made as described in Chen et al., Advanced Energy Materials 3 (2013), pp. 1210-14, which is incorporated in its entirety by reference herein. The hot pressed p-type and n-type half-Heusler materials were formed into the legs 305, 306 of size 1.8 mm×1.8 mm×2 mm and fabricated into the device 300 shown in FIG. 4. The output power from the device 300 was measured with a 100-600° C. temperature gradient between the "hot" 316 and "cold" 318 sides of the device 300 over more than 500 thermal cycles.

Figure 5A:
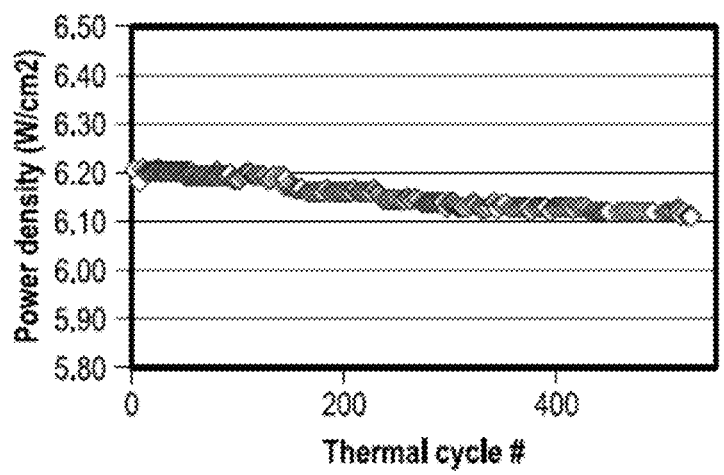
FIGS. 5A-B are plots of the power density (FIG. 5A) and open circuit voltage (FIG. 5B) of an embodiment thermoelectric device employing thermoelectric materials fabricated according to certain embodiments of the present disclosure measured with 100-600° C. temperature gradient over >500 thermal cycles.
Figure 5B:
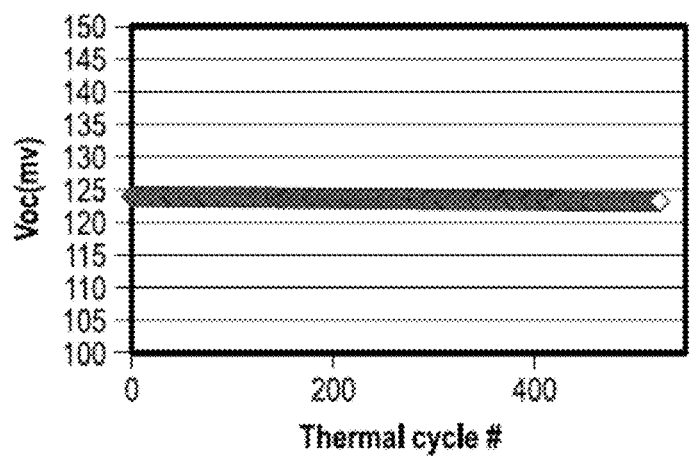

FIG. 5A is a plot of the power density of the device 300 of FIG. 4 over more than 500 thermal cycles. FIG. 5B is a plot of the open circuit voltage (Voc) of the device 300 over the >500 thermal cycles. The average device resistance was 2 milliohms. The average power density (100-600° C.) was 6.1 W/cm$^2$. The average open circuit voltage (100-600° C.) was 121 mV, and the current was 10 A for a power of 0.75 W from two pairs of legs. As shown in FIGS. 5A-B, the device 300 performance was stable within 2% for more than 500 thermal cycles of 100-600° C.

Figure 6A:
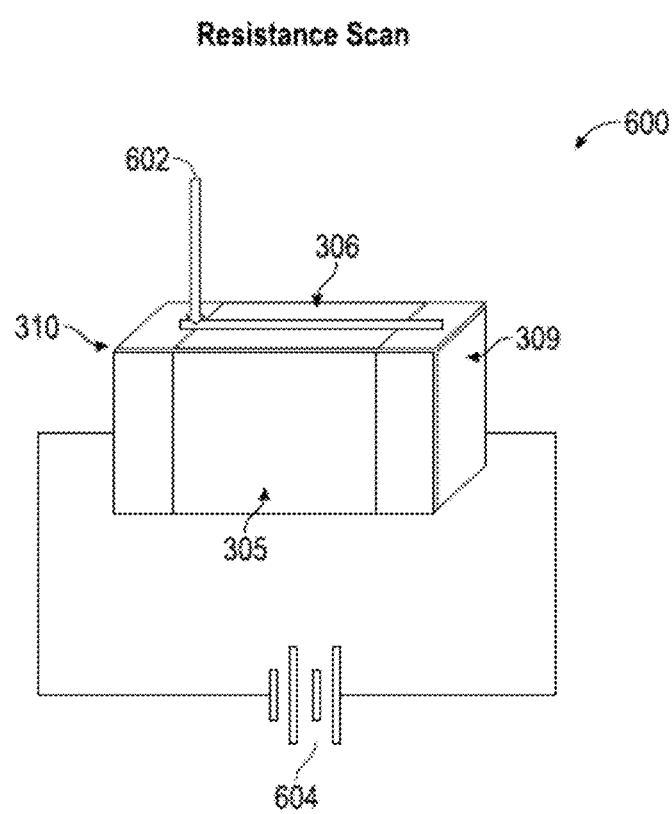
FIG. 6A schematically illustrates a resistance scan for measuring resistance at various distances along the length of a thermoelectric device employing thermoelectric materials fabricated according to certain embodiments of the present disclosure.

FIG. 6A schematically illustrates the experimental setup for performing a resistance scan of a thermoelectric device 600, which may be similar to the device 300 of FIG. 4. A current 602 may be provided through the device via current leads and the voltage drop 604 across sensing terminals may be measured as one of the sensing terminals (e.g., probe) is moved to different positions along the length of the device (e.g., from a first metal (copper) contact 309, along the length of the p-type 305 and/or n-type 306 thermoelectric material leg, to the second metal (copper) contact) 310. The voltage measured by the probe is proportional to the resistance of the device 600, and may be used to determine the contact resistance of the device 600.

Figure 6B:
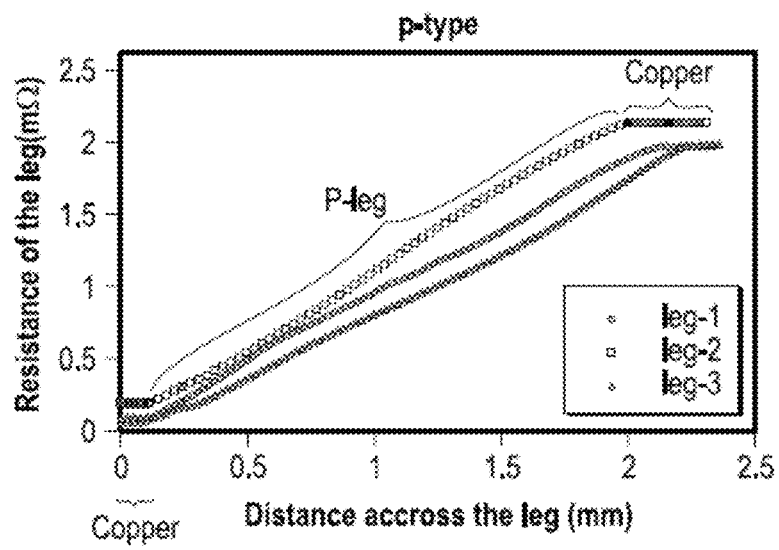
FIGS. 6B and 6C are plots illustrating resistance scans for a p-type (FIG. 6B) and n-type (FIG. 6C) thermoelectric legs fabricated according to certain embodiments of the present disclosure showing low contact resistance between the respective thermoelectric legs and metal (copper) contacts at opposite ends of the legs.
Figure 6C:
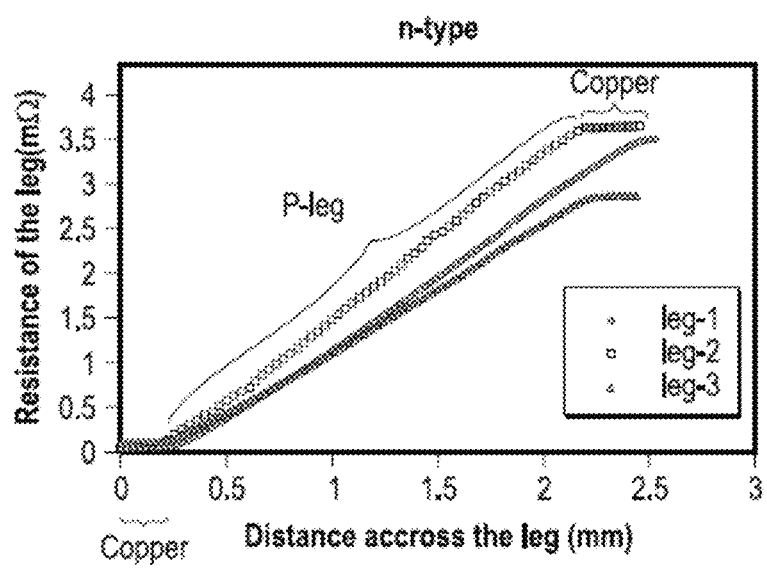

FIG. 6B is a plot of resistance vs. distance for three nanocomposite p-type NbFeSb-based half-Heulser thermoelectric material legs having the same composition and made as described above. The resistance scan of FIG. 6B shows very good contact (i.e., low contact resistance) between the p-type legs and the copper connectors, the two points at which the leg is in contact with the copper connectors are noted, as is the region which is in between. FIG. 6C is a plot of the resistance vs. distance for three n-type half-Heusler thermoelectric material legs fabricated in accordance with the Chen et al. article described above. The resistance scan of FIG. 6C also shows very good contact (i.e., low contact resistance) between the n-type legs and the copper connectors. Low contact resistance is important for making a device having high power and reliability.

Figure 7:
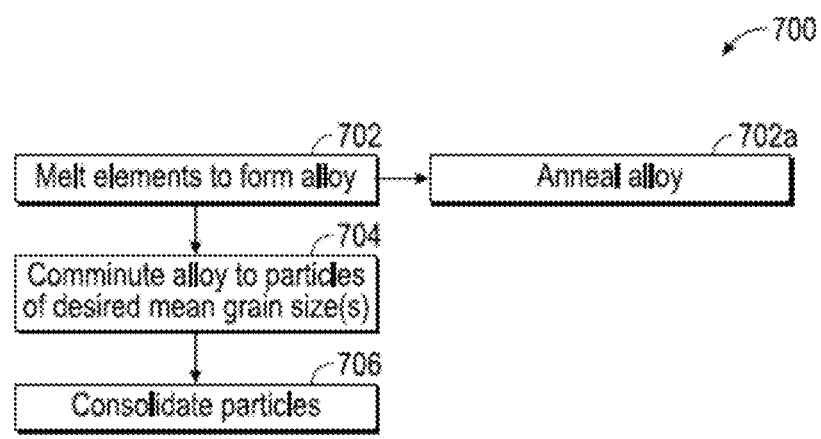
FIG. 7 is a flow chart of a method 700 of manufacturing thermoelectric devices and components according to certain embodiments of the present disclosure.

Turning now to method 700 n FIG. 7, in an embodiment at block 702, a plurality of elements are melted to form an alloy of the thermoelectric material according to a formula $Nb_{1+\delta-x}A_xFe_{1-y}Co_ySb_{1+\delta-z}Sn$, where A comprises one or more of titanium (Ti), zirconium (Zr), hafnium (Hf), vanadium (V), tantalum (Ta), chromium (Cr), molybdenum (Mo), tungsten (W), and a rare earth element, and $0 \leq x < 1.0$, $0 \leq y < 1.0$ and $0 \leq z < 1.0$ and $-0.1 \leq \delta \leq 0.1$. In alternate embodiments, the values of x, y, z, and 6 may vary as discussed herein. The melting at block 702 may comprise arc melting and/or induction melting, and in some embodiments, the alloy formed at block 702 may be annealed prior to block 704 at block 702a. The annealing at block 702a may comprise using a temperature of 600-800° C. and a sub-atmospheric environment and holding the alloy in about this temperature range from about 0.5 days to about 3 days. At block 704, the alloy fabricated at block 702 is comminuted, for example, by ball-milling, until the mean grain size of the resulting particles, which may be referred to as a powder, is less than 1 micron. In some embodiments, the mean grain size may be from about 10 nm to about 500 nm, and in alternate embodiments the particles may be a combination of sizes, e.g., wherein a first percentage of particles comprises a first mean size and a second percentage of particles comprises a second, different mean size. In that embodiment, at block 706, the particles of different mean sizes are consolidated, for example, by hot-pressing, to form a thermoelectric material. In an embodiment, a dimensionless figure of merit, ZT, of the thermoelectric material is $\geq 0.8$ for at least one temperature in the range 600-800° C. In an alternate embodiment, the dimensionless figure of merit, ZT, of the material is $\geq 0.9$ for at least one temperature in the range 600-800° C. In another alternate embodiment, the dimensionless figure of merit, ZT, of the material is 0.9-0.96 at 700° C.

Figure 8A:
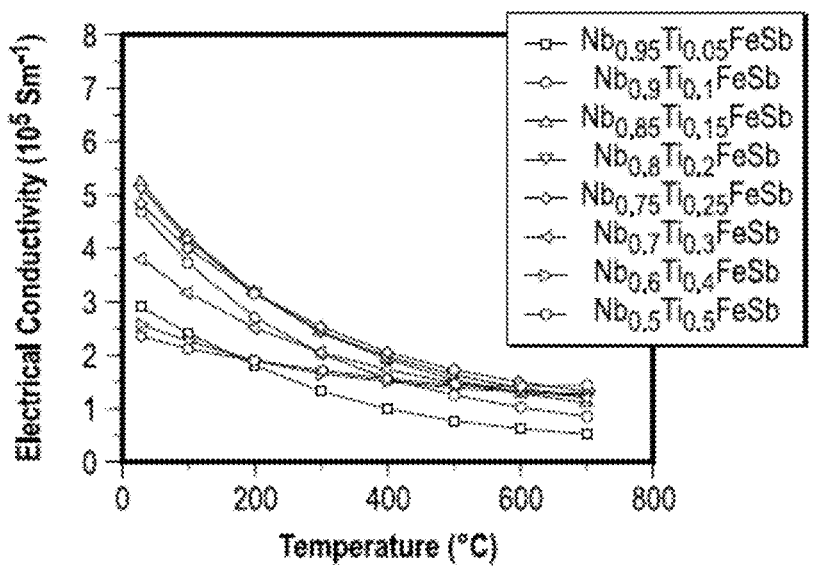
FIGS. 8A-8F are graphs of temperature dependent properties of thermoelectric materials fabricated according to certain embodiments of the present disclosure.
Figure 8B:
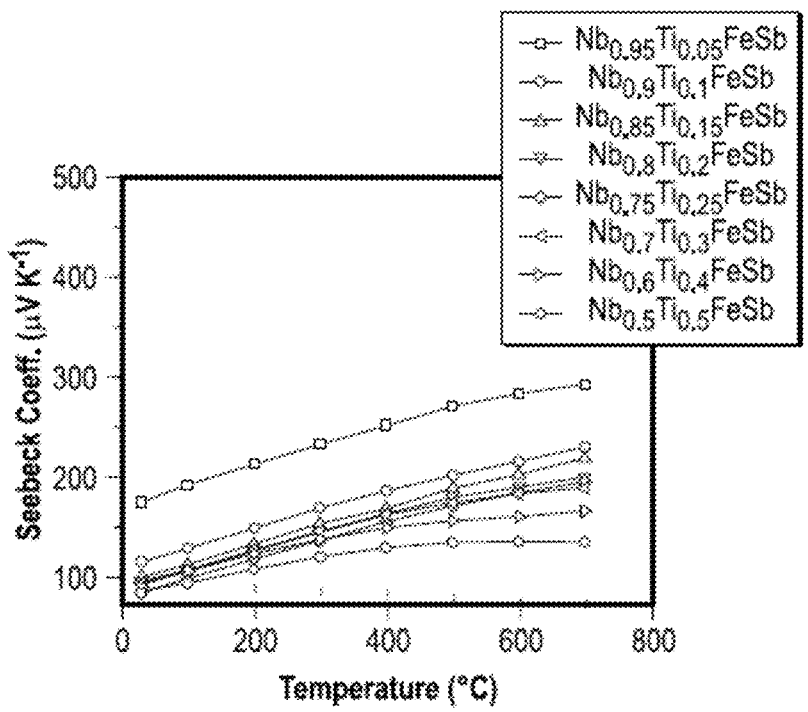
Figure 8C:
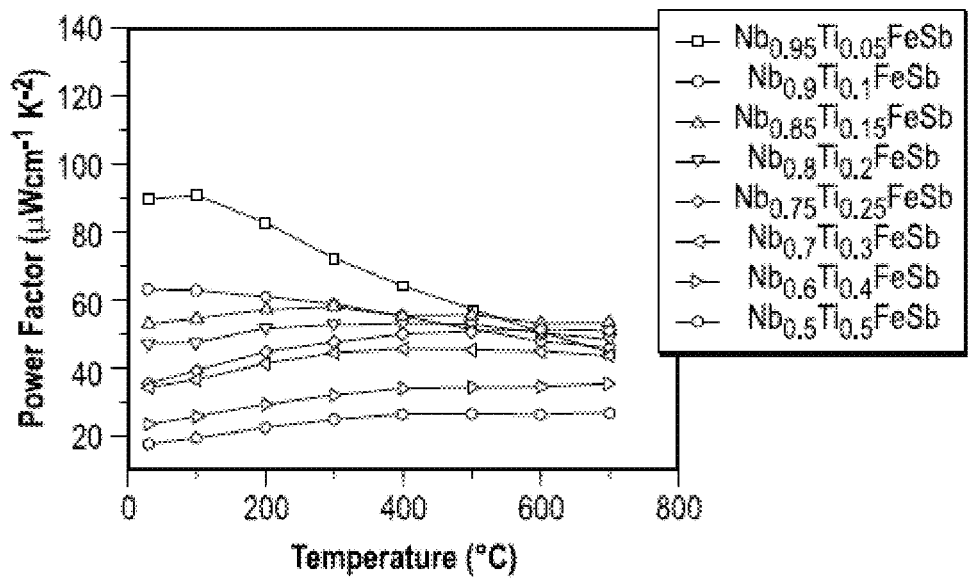
Figure 8D:
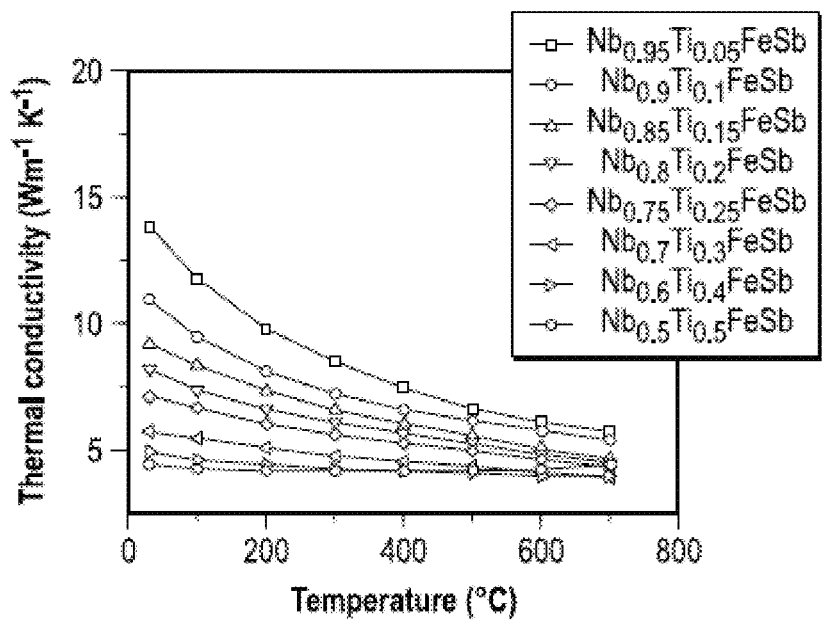
Figure 8E:
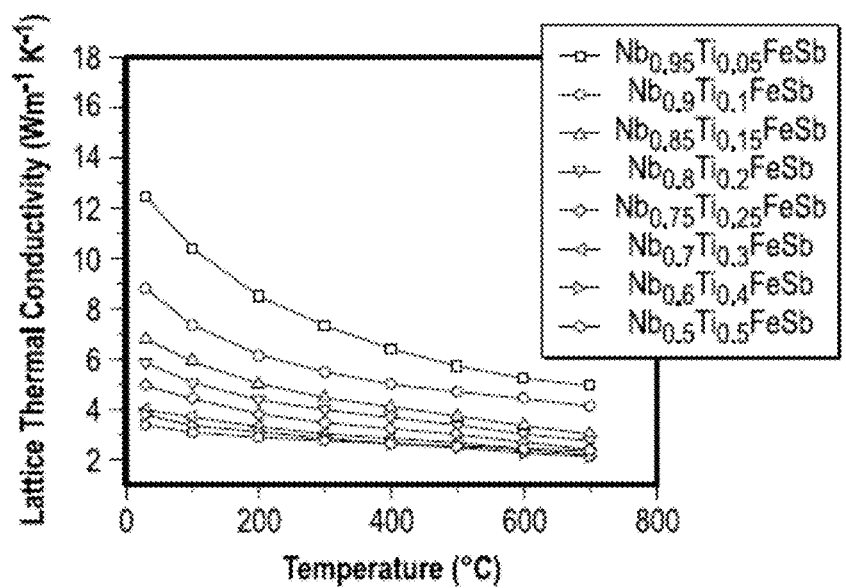
Figure 8F:
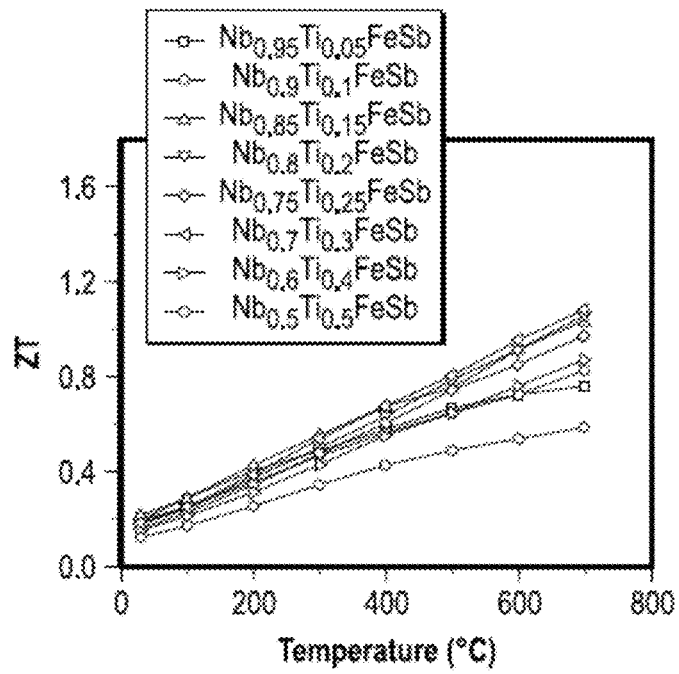

Referring now to FIGS. 8A-8F, the temperature dependent properties of NbTiFeSb samples of varying compositions are illustrated. The plurality of samples were fabricated according to embodiments of the present disclosure according to the methods discussed herein including that of FIG. 7. The samples fabricated were according to the formula $Nb_xTi_yFeSb$, where x+y=1, and where x is from about 0.95 to about 0.5. As illustrated in FIG. 8A, the electrical conductivity of the samples increases to some extent with increasing Ti content as the temperature increases, though the electrical conductivities for the samples with a Ti content from about 0.5 to about 0.15 are above those where the Ti content is below 0.15. FIG. 8B illustrates the Seebeck coefficient of the samples discussed in FIG. 8A. The Seebeck coefficient, as illustrated in FIG. 8B, increases with increasing temperature, with the maximum at about 300 μV for the $Nb_{0.95}Ti_{0.05}FeSb$ sample at about 700° C. and about 150 μV $K^{-1}$ for the $Nb_{0.5}Ti_{0.5}FeSb$ sample at about 700° C. FIG. 8C illustrates the power factor for the samples, measured up to 700° C., the lowest value of about 27 μW $cm^{-1}K^{-2}$ at that temperature is exhibited by the sample with the highest Ti content and the highest value of about 60 μW $cm^{-1}K^{-2}$ was exhibited by the sample comprising a Ti content of about 0.15. The thermal conductivity as seen in FIG. 8D illustrates that the largest drop in thermal conductivity as the temperature increased was observed in the sample comprising a Ti content of about 0.05, and less of a drop was observed in samples with higher Ti content. Turning to FIG. 8E, the graph of the lattice thermal conductivity, similar to the thermal conductivity results in FIG. 8D, the largest drop in lattice thermal conductivity as the temperature was increased was observed in the sample comprising a Ti content of about 0.05, and less of a drop was observed in samples with higher Ti content. FIG. 8F illustrates the ZT for each sample, the maximum ZT values observed were over about 1.0 for the samples comprising a Ti content of 0.3, 0.25, and 0.2, with the sample comprising the 0.3 Ti content having the highest value of the three at about 1.1.

Figure 9A:
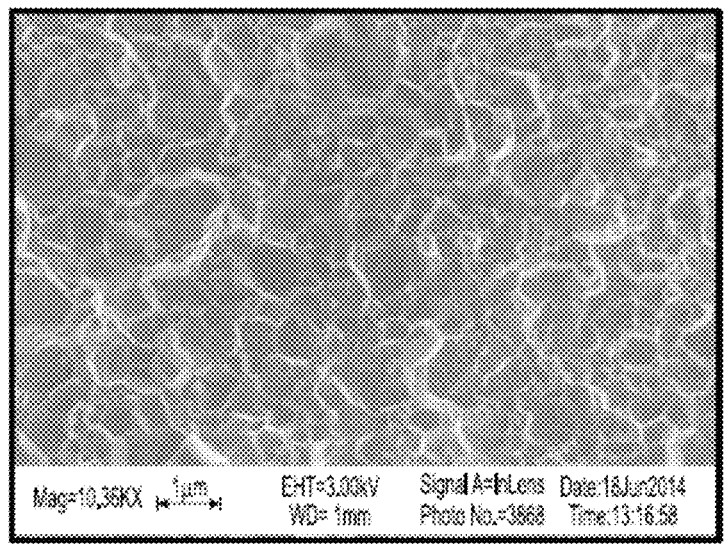
FIGS. 9A-9D are scanning electron microscopy (SEM) images of samples of $Nb_{0.75}Ti_{0.225}Zr_{0.025}FeSb$ fabricated according to certain embodiments of the present disclosure.
Figure 9B:
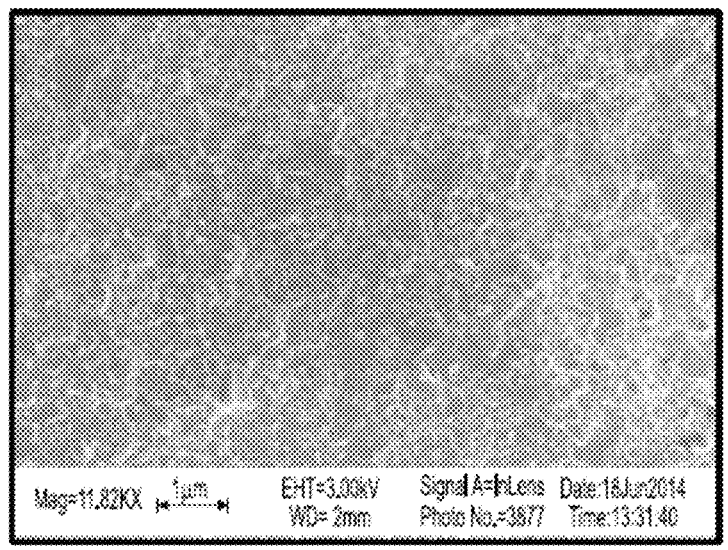
Figure 9C:
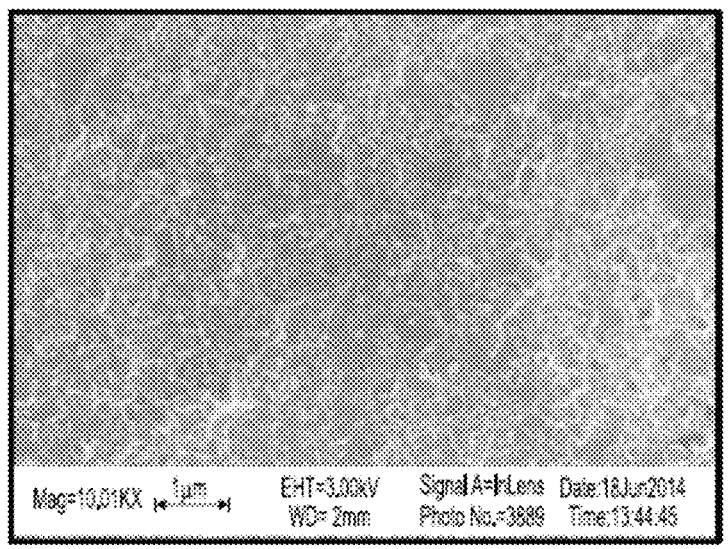
Figure 9D:
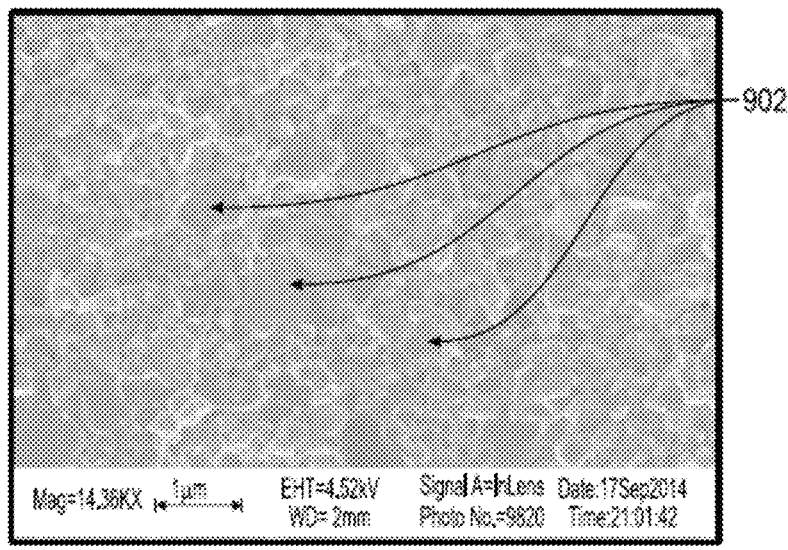

In another embodiment, a plurality of samples were fabricated according to embodiments of the present disclosure by changing the ball-milling time, mixing powders of different mean size particles, and by adjusting the amount of Zr in the formula $Nb_xTi_yZr_qFeSb$, where $x+y+q=1$. In an embodiment, x, y, and q, may be, respectively, from about 0.025 to about 0.95. Turning to FIGS. 9A-9D, a plurality of samples of $Nb_{0.75}Ti_{0.25}FeSb$ were, respectively, ball-milled for 7 hours (FIG. 9A), 15 hours (FIG. 9B), and 20 hours (FIG. 9C). The grain size decreases with increasing ball-milling time, as shown in FIGS. 9A through 9C. FIG. 9D is an SEM image of an embodiment of a sample of $Nb_{0.75}Ti_{0.25}FeSb$ mixed according to the ratio of 7 h:15 h:20 h of 1:1:2, the variation in grain 902 sizes can be observed in this image.

Figure 10A:
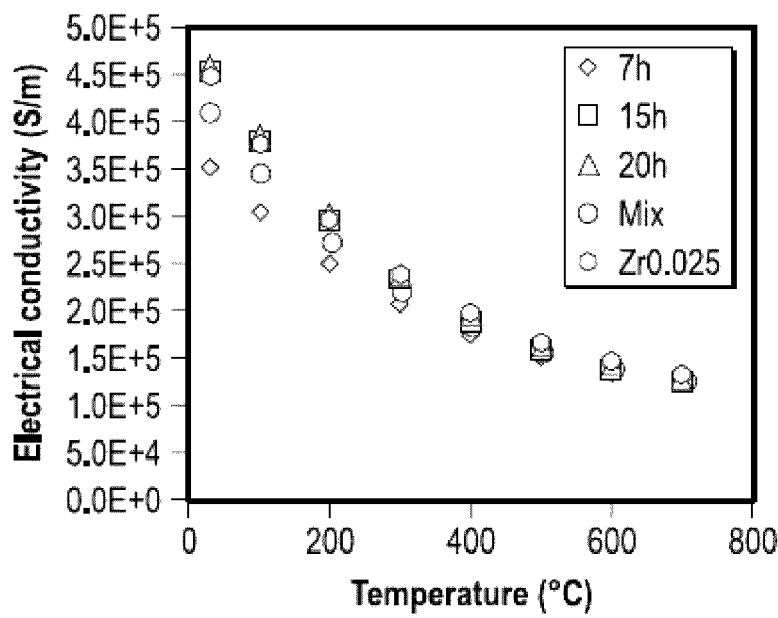
FIGS. 10A-10D are graphs that illustrate the temperature dependency of thermoelectric properties of the samples discussed in FIGS. 9A-9D fabricated according to certain embodiments of the present disclosure.
Figure 10B:
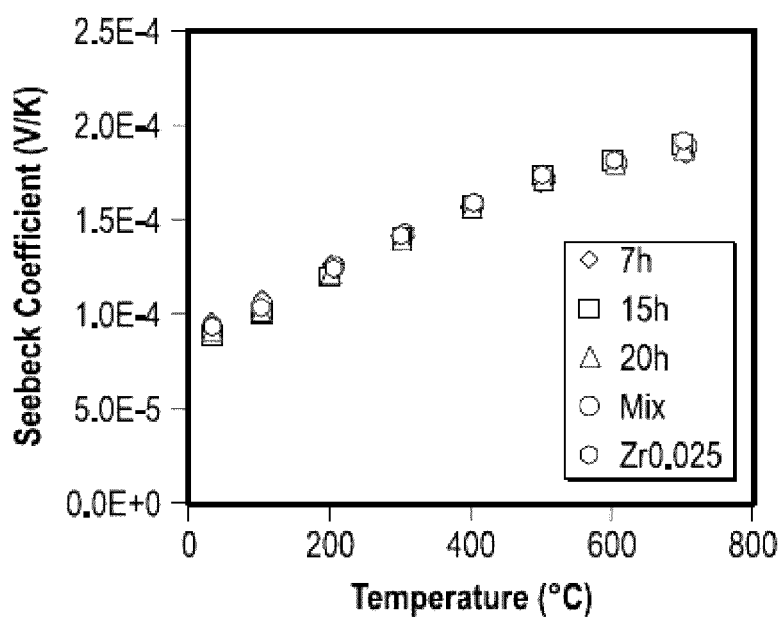
Figure 10C:
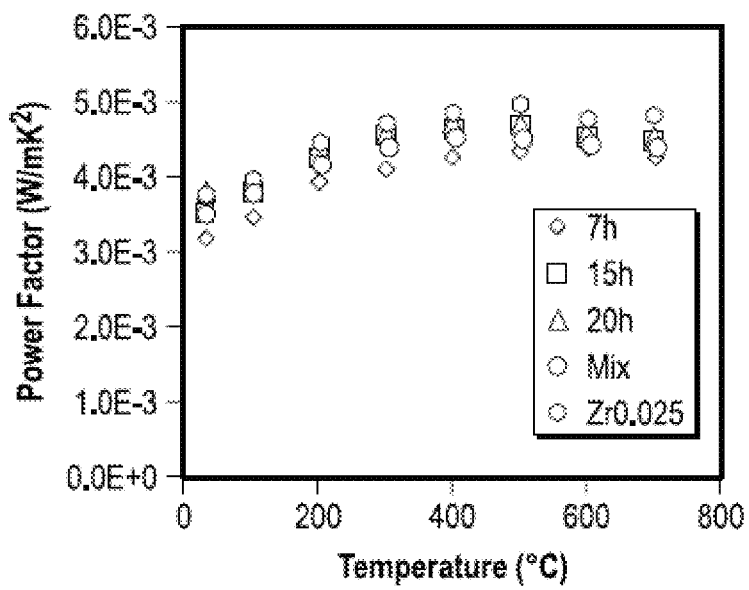
Figure 10D:
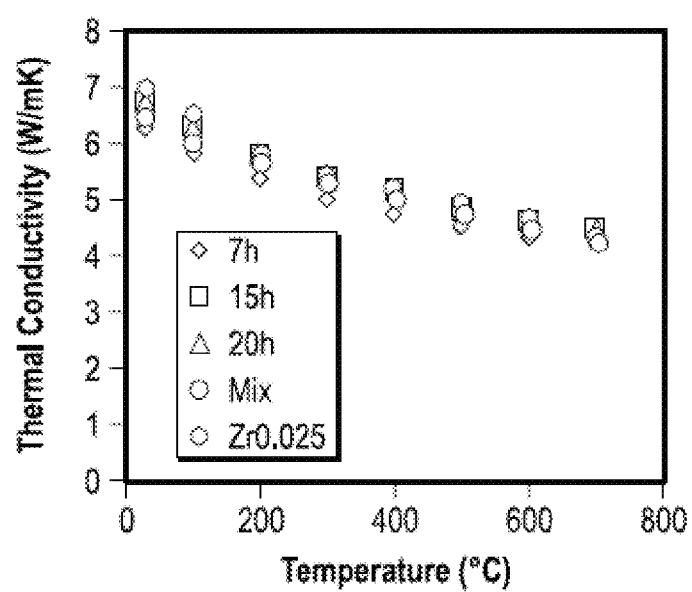

FIGS. 10A-10D illustrate the temperature dependency of the samples discussed in FIGS. 9A-9D. The temperature dependent properties were observed for $Nb_{0.75}Ti_{0.225}Zr_{0.025}FeSb$ and the samples of $Nb_{0.75}Ti_{0.25}FeSb$ ball-milled for the varying times discussed above of 7 hours, 15 hours, 20 hours, and the mixed sample of FIG. 9D. The electrical conductivity (FIG. 10A) decreased with increasing temperature, with the sample comprising Zr exhibiting a slightly higher electrical conductivity at about 700° C. than the other samples. The Seebeck coefficient increased with the increasing temperature, with the Zr-containing exhibiting a slightly higher Seebeck coefficient as shown in FIG. 10B as compared to the other samples. FIG. 10C shows that the power factor of the Zr-containing sample was higher than the other samples, with a peak of about $5.0 \times 10^{-3}$ W $m^{-1}K^{-2}$ at about 500° C., and FIG. 10D illustrates that the respective thermal conductivities of the samples decrease with increasing temperature with the difference between values associated with each sample also decreasing with increasing temperature.

Figure 11:
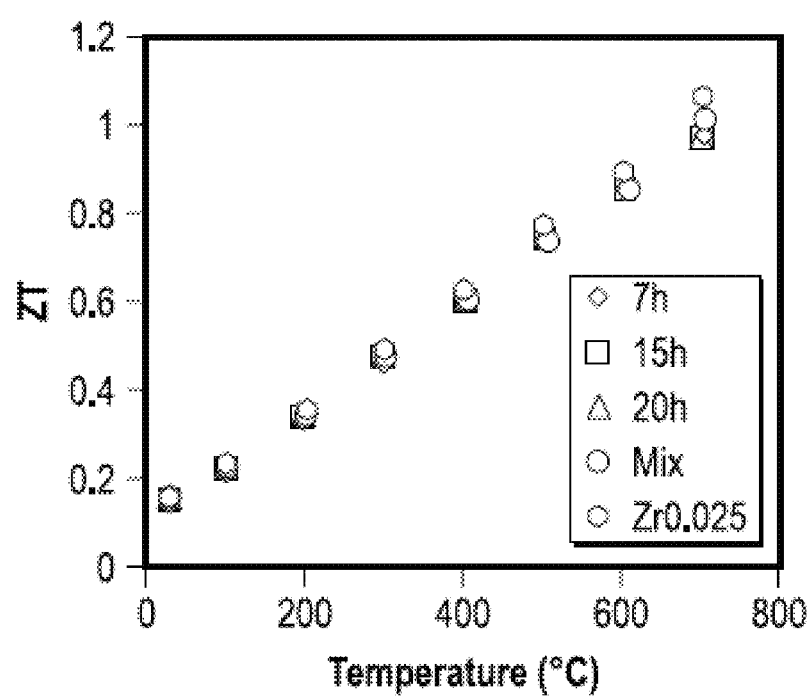
FIG. 11 is a graph illustrating the temperature dependency of the figure of merit (ZT) of the samples discussed in FIGS. 9A-9D fabricated according to certain embodiments of the present disclosure.

Referring now to FIG. 11, the ZT increases with temperature in each of the ball-milled samples of $Nb_{0.75}Ti_{0.25}FeSb$, the mixed sample discussed in FIGS. 9A-0D and the 10A-10D above $Nb_{0.75}Ti_{0.225}Zr_{0.025}FeSb$. FIG. 11 illustrates that the peak ZT achieved was for the Zr-containing sample, and is about 1.1 at about 700° C.

Figure 12A:
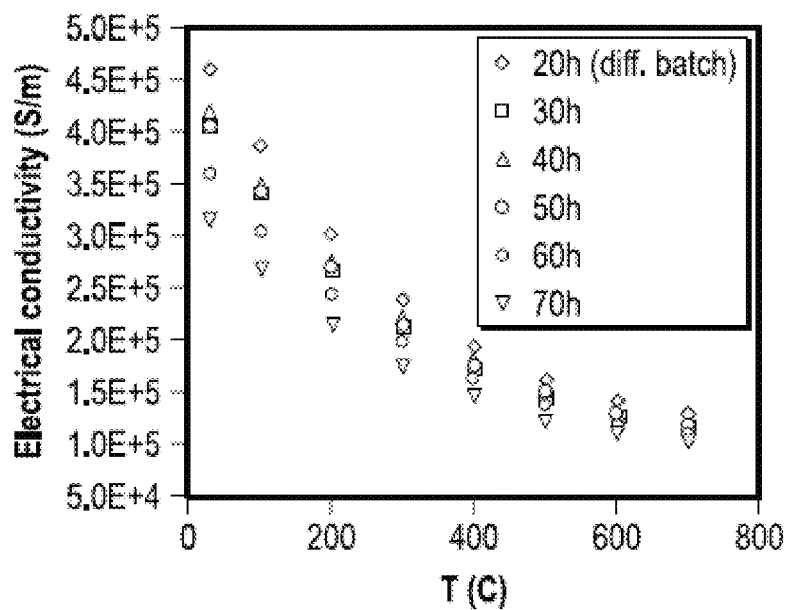
FIGS. 12A-12D are graphs that illustrate the temperature dependency of thermoelectric properties of thermoelectric materials fabricated according to certain embodiments of the present disclosure.
Figure 12B:
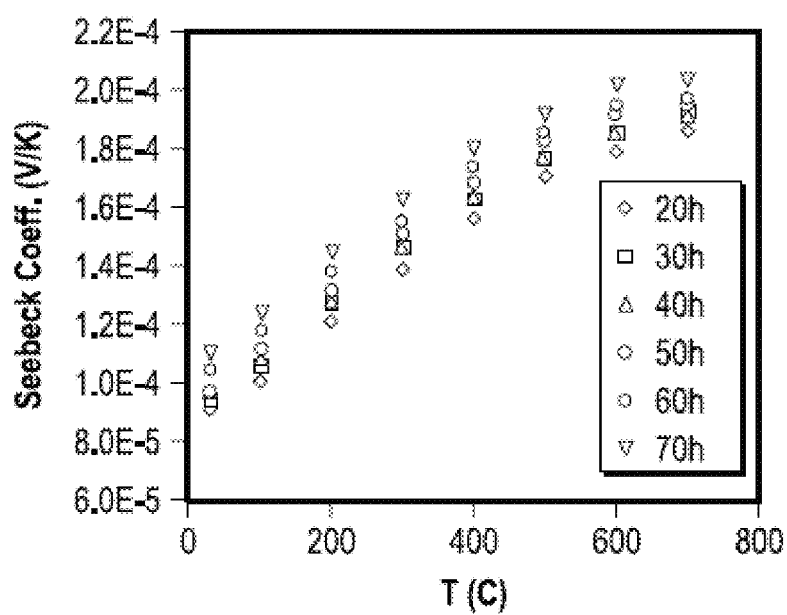
Figure 12C:
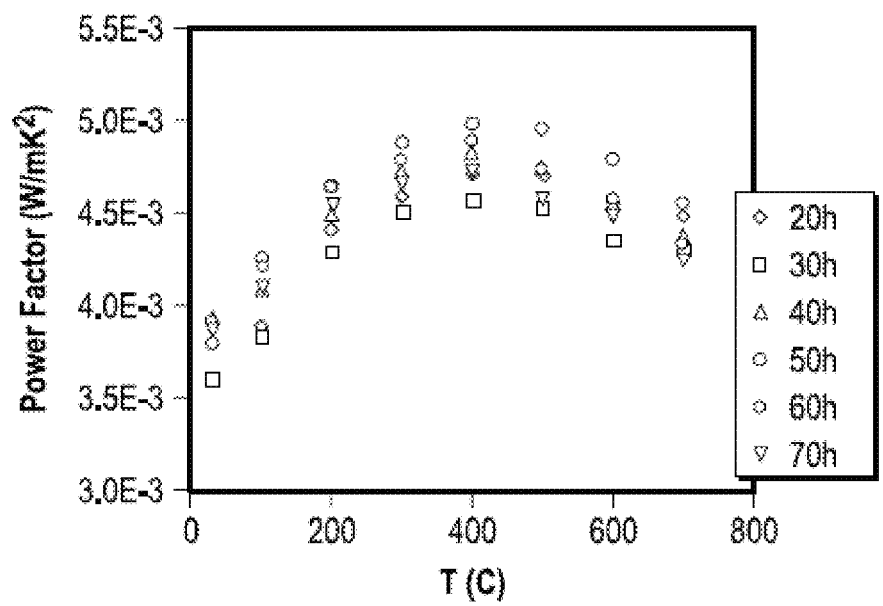
Figure 12D:
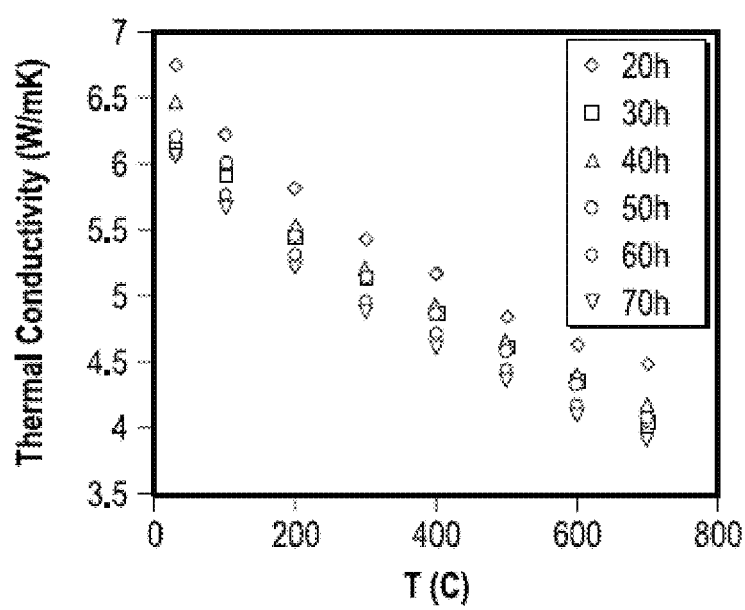

Turning to FIGS. 12A-12D, a plurality of samples fabricated according to the formula $Nb_{0.75}Ti_{0.25}FeSb$ were ball milled for 20 hours, 30 hours, 40 hours, 50 hours, 60 hours, and 70 hours, respectively. The electrical conductivity (FIG. 12A) decreased for all of the samples with increasing temperature, with the lowest electrical conductivity at about $1.0 \times 10^{-5}$ at about 700° C. for the sample ball-milled for about 70 hours, and the highest value at that temperature was observed for the sample ball-milled for 20 hours (which is not the same sample discussed in FIGS. 9A-9D and 10A-10D). The Seebeck coefficient's dependency on temperature for the samples is illustrated in FIG. 12B, which shows that the Seebeck coefficient is at a maximum at 700° C. for the sample ball-milled for about 70 hours (above about $2.0 \times 10^{-4}$). The power factor for these samples is shown in FIG. 12C, which illustrates a peak power factor of about $5.0 \times 10^3$ $W/mK^2$ at about 400° C. for the sample ball-milled for about 50 hours, and that the minimum power factor of about $4.5 \times 10^3$ $W/mK^2$ at the same temperature was observed for the sample ball milled for about 30 hours. The thermal conductivity for the samples is illustrated in FIG. 12D's graph, which reflects that the thermal conductivity for all of the samples decreases with increasing temperature, with the highest thermal conductivity observed at 700° C. for the sample ball milled for 20 hours and the lowest thermal conductivity observed at the for the samples ball milled for 60 hours and 70 hours, which did not exhibit a significant comparable difference at that temperature.

Figure 13:
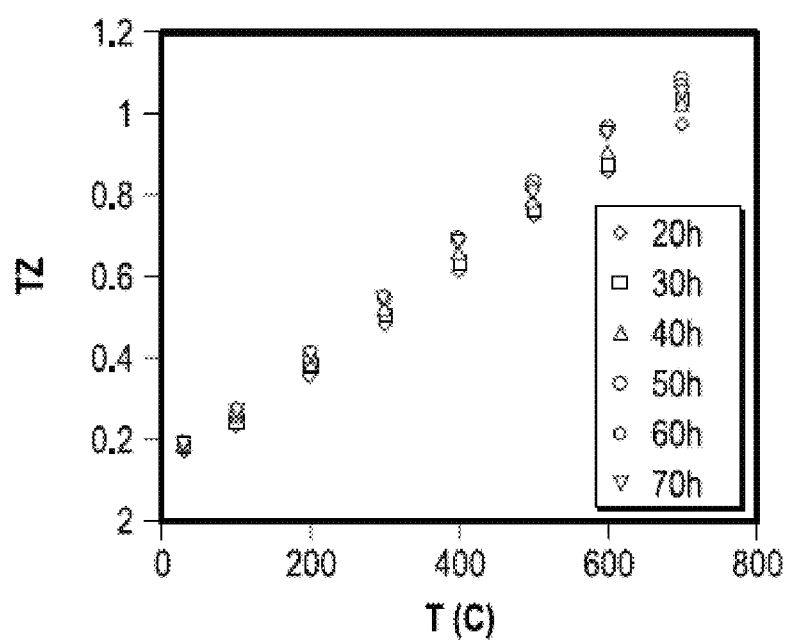
FIG. 13 is a graph illustrating the temperature dependency of the figure of merit (ZT) of samples fabricated according to certain embodiments of the present disclosure.

Turning to FIG. 13, the ZT for the samples discussed in FIGS. 12A-12D is illustrated. The peak ZT was observed at 700° C. as being about 1.1 for the sample ball milled for about 50 hours, and the samples ball-milled for 60 hours and 70 hours were near that value but slightly lower, with the ZT for the 60 hour sample being slightly above that for the 70 hour sample, which may indicate that targeting a grain size or range of grain sizes (as achieved by ball-milling) may result in a product tailored to meet a predetermined ZT value. The lowest ZT at 700° C. was observed by the sample ball milled for 20 hours.

Exemplary embodiments are disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, ..., 50 percent, 51 percent, 52 percent, ..., 95 percent, 96 percent, 97 percent, 98 percent, 99 percent, or 100 percent. Moreover, any numerical range defined by two R numbers as defined in the above is also specifically disclosed. Use of broader terms such as "comprises," "includes," and "having" should be understood to provide support for narrower terms such as "consisting of," "consisting essentially of," and "comprised substantially of." Accordingly, the scope of protection is not limited by the description set out above but is defined by the claims that follow, that scope including all equivalents of the subject matter of the claims. Each and every claim is incorporated into the specification as further disclosure, and the claims are exemplary embodiment(s) of the present invention.

While exemplary embodiments of the invention have been shown and described, modifications thereof can be made by one skilled in the art without departing from the scope or teachings herein. The embodiments described herein are exemplary only and are not limiting. Many variations and modifications of the compositions, systems, apparatus, and processes described herein are possible and are within the scope of the invention. Accordingly, the scope of protection is not limited to the exemplary embodiments described herein, but is only limited by the claims that follow, the scope of which shall include all equivalents of the subject matter of the claims. Unless expressly stated otherwise, the steps in a method claim may be performed in any order and with any suitable combination of materials and processing conditions.

What is claimed is:

1. A thermoelectric half-Heusler material comprising:
niobium (Nb), iron (Fe), tin (Sn), and antimony (Sb), according to a formula $Nb_{1+\delta-x}A_xFe_{1-y}Co_ySb_{1+\delta-z}Sn_z$ wherein the material comprises a mean grain size less than one micron subsequent to hot-pressing,
wherein the material comprises an electrical resistivity above $4.00\times10^{-6}$ ohm-mm and a thermal conductivity above 4.0 W/mK at above about 573 K.

2. The thermoelectric material of claim 1, further comprising at least one of scandium (Sc) or yttrium (Y).

3. The thermoelectric material of claim 1, wherein A comprises one or more of titanium (Ti), zirconium (Zr), hafnium (Hf), vanadium (V), tantalum (Ta), chromium (Cr), molybdenum (Mo), tungsten (W), or a rare earth element, and $0 \leq x < 1.0$, $0 \leq y < 1.0$, $0 \leq z < 1.0$, and $-0.1 \leq \delta \leq 0.1$.

4. The thermoelectric material of claim 1, wherein A comprises one or more of titanium (Ti), zirconium (Zr), hafnium (Hf), vanadium (V), tantalum (Ta), chromium (Cr), molybdenum (Mo), tungsten (W), or a rare earth element, and $0 \leq x < 1.0$, $0 \leq y < 1.0$, $0 \leq z < 1.0$, and $\delta = 0.1$.

5. The thermoelectric material of claim 1, wherein the material comprises a p-type half-Heulser thermoelectric material with the formula $Nb_{1+\delta-x}Ti_xFe_{1-y}Co_ySb_{1+\delta-z}Sn_z$ and $0 \leq x \leq 0.5$, $0 \leq y < 1.0$, $0 \leq z \leq 0.2$ and $-0.1 \leq \delta \leq 0.1$.

6. The thermoelectric material of claim 1, wherein the material comprises a p-type half-Heusler thermoelectric material with the formula $Nb_{1+\delta-x}Ti_xFe_{1-y}Co_ySb_{1+\delta-z}Sn_z$ and $0.05 \leq x \leq 0.4$, $0 \leq y < 1.0$, $0 < z \leq 0.1$ and $-0.1 \leq \delta \leq 0.1$.

7. The thermoelectric material of claim 1, wherein a dimensionless figure of merit, ZT, of the material is $\geq 0.8$ for at least one temperature in the range 600-800° C.

8. The thermoelectric material of claim 1, wherein the mean grain size of the thermoelectric material is less than 300 nm subsequent to hot-pressing.

9. The thermoelectric material of claim 1, wherein at least 90% of the grains have a grain size less than 500 nm subsequent to hot-pressing.

10. The thermoelectric material of claim 1, wherein the mean grain size is $\geq 10$ nm.

11. The thermoelectric material of claim 1, wherein at least a portion of the grains comprise at least one 10-50 nm size nanodot inclusion within the grain.

12. A method of making a nanocomposite half-Heusler thermoelectric material comprising:
melting, via arc melting or induction melting, a plurality of constituent elements comprising niobium (Nb), iron (Fe), and antimony (Sb) to form an ingot of an alloy of the half-Heusler thermoelectric material, wherein the alloy is according to a formula of $Nb_{1-x}A_xFeSb$;
comminuting, via ball-milling, the alloy of the thermoelectric material into nanometer scale mean size particles; and
consolidating, via hot-pressing, the nanometer scale mean size particles to form, subsequent to hot-pressing, the half-Heusler thermoelectric material with a mean grain size less than one micron wherein the material comprises an electrical conductivity below $2.0\times10^5$ $Sm^{-1}$ and a thermal conductivity below W/mK at above about 773 K.

13. The method of claim 12, further comprising:
annealing the ingot of the alloy of the thermoelectric material at a temperature of 600-800° C. in a sub-atmospheric environment for 0.5-3 days prior to comminuting.

14. The method of claim 12, wherein the nanometer scale mean size particles have a mean particle size in a range of 5-100 nm.

15. The method of claim 12, wherein hot pressing the particles formed from the ingot comprises hot pressing at a peak temperature of 700-1100° C. and a pressure of 60-200 MPa.

16. The method of claim 12, wherein the half-Heusler thermoelectric material further comprises tin (Sn).

17. The method of claim 12, wherein A comprises at least one of titanium (Ti), zirconium (Zr), vanadium (V), tantalum (Ta), chromium (Cr), molybdenum (Mo), tungsten (W), cobalt (Co), or a rare earth element.

18. The method of claim 12, wherein a dimensionless figure of merit, ZT, of the half-Heusler thermoelectric material is $\geq 0.8$ for at least one temperature in the range 600-800° C.

19. The method of claim 12, wherein consolidating the nanometer scale mean size particles comprises consolidating the particles to form the half-Heusler thermoelectric material having a mean grain size less than 300 nm.

20. The method of claim 19, wherein consolidating the nanometer scale mean size particles comprises consolidating the particles to form the half-Heusler thermoelectric material wherein at least one of:
(i) at least 90% of the grains have a grain size less than 500 nm,
(ii) the mean grain size is $\geq 10$ nm, and
(iii) at least a portion of the grains include a 10-50 nm size nanodot inclusion within the grain.

21. A thermoelectric half-Heusler material comprising:
niobium (Nb), iron (Fe) and antimony (Sb), wherein at least one of:
(i) a portion of the niobium in the half-Heusler material is substituted with titanium (Ti); and
(ii) a portion of the antimony in the half-Heusler material is substituted with tin (Sn), wherein the niobium, iron, antimony, titanium, and tin are ball-milled and hot-pressed to form the half-Heusler material comprising a mean grain size of less than 300 nm, an electrical resistivity above $4.00\times10^{-6}$ ohm-mm at above about 573 K, and a thermal conductivity above 4.0 W/mK at above about 573 K.

22. The thermoelectric half-Heusler material of claim 21, wherein a portion of the iron in the half-Heusler material is substituted with cobalt (Co).

23. The thermoelectric half-Heusler material of claim 21, wherein the material further comprises at least one of zirconium, (Zr), hafnium (Hf), vanadium (V), tantalum (Ta), chromium (Cr), molybdenum (Mo), tungsten (W), or a rare earth element.

24. The thermoelectric material of claim 21, wherein up to 50 At % of the niobium in the half-Heusler material is substituted with titanium.

25. The thermoelectric material of claim 24 wherein 5-50 At % of the niobium in the half-Heusler material is substituted with titanium.

26. The thermoelectric material of claim 25, wherein 25-40 At % of the niobium in the half-Heusler material is substituted with titanium.

27. The thermoelectric material of claim 21, wherein up to 20 At % of the antimony in the half-Heusler material is substituted with tin.

28. The thermoelectric material of claim 27, wherein the portion of antimony substituted with tin is greater than 0 At % and less than or equal to 10 At %.

29. A thermoelectric device comprising:
a first pair of thermoelectric legs, each of the first pair of legs comprising a first end, a second end, and a first n-type thermoelectric material; a second pair of thermoelectric legs, each of the second pair of legs comprising a first end, a second end, and a p-type thermoelectric material, wherein the first pair of thermoelectric legs are disposed parallel to the second pair of thermoelectric legs, and wherein the p-type thermoelectric material comprises a composition according to the formula $Nb_xTi_yFeSb$, wherein x+y=1, a ZT above 0.8 above about 873 K, and a mean grain size less than 1 micron;
a first end of the device comprising a first electrical conductor and a second electrical conductor coupled to the first end of each of the first pair of thermoelectric legs and the first end of each of the second pair of thermoelectric legs; and
a second end of the device comprising a header coupled to the second end of each of the first pair of thermoelectric legs and to the second end of each of the second pair of the thermoelectric legs.

30. The device of claim 29, wherein the header comprises an electrically conductive material on a first surface, wherein the first surface is coupled to the second end of the first pair of thermoelectric legs and to the second end of the second pair of the thermoelectric legs, wherein the header comprises an electrically insulating material on a second surface of the header, wherein the second surface of the header is opposite the first surface.

31. The device of claim 29, wherein the header comprises an electrically conductive material on a first surface of the header in contact with an electrically insulating material and a second electrically conductive material in contact with the electrically insulating material, wherein the first surface of the header is coupled to the second end of the first pair of thermoelectric legs and to the second end of the second pair of the thermoelectric legs.

32. The device of claim 29, wherein the first electrical conductor is coupled to a first side of an electrically insulating material and a second side of the electrically insulating material is coupled to a third electrical conductor, wherein the second electrical conductor is coupled to a first side of an electrically insulating material and wherein a second side of the electrically insulating material is coupled to a third electrical conductor, and at least one of the first electrical conductor, the second electrical conductor, and the electrically conductive material comprise a pattern, wherein the pattern comprises a circuit path.

33. The device of claim 29, wherein an output power of the device comprises a temperature gradient from about 100 to about 600° C. between the first end of the device and the second end of the device after about 500 thermal cycles.

* * * * *